US011218145B2

(12) United States Patent
Rajashekara et al.

(10) Patent No.: US 11,218,145 B2
(45) Date of Patent: Jan. 4, 2022

(54) HIGH TEMPERATURE GATE DRIVER FOR SILICON CARBIDE METAL-OXIDE-SEMICONDUCTOR FIELD-EFFECT TRANSISTOR

(71) Applicant: University of Houston System, Houston, TX (US)

(72) Inventors: Kaushik Rajashekara, Pearland, TX (US); Parthasarathy Nayak, Houston, TX (US); Sumit Kumar Pramanick, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 51 days.

(21) Appl. No.: 16/642,089

(22) PCT Filed: Aug. 21, 2018

(86) PCT No.: PCT/US2018/047178
§ 371 (c)(1),
(2) Date: Feb. 26, 2020

(87) PCT Pub. No.: WO2019/046033
PCT Pub. Date: Mar. 7, 2019

(65) Prior Publication Data
US 2020/0212907 A1  Jul. 2, 2020

Related U.S. Application Data

(60) Provisional application No. 62/551,982, filed on Aug. 30, 2017.

(51) Int. Cl.
*H03K 17/00* (2006.01)
*H03K 17/082* (2006.01)
(Continued)

(52) U.S. Cl.
CPC ....... *H03K 17/0822* (2013.01); *H03K 17/145* (2013.01); *H03K 17/6877* (2013.01); *H03K 17/691* (2013.01); *H03K 2217/0027* (2013.01)

(58) Field of Classification Search
None
See application file for complete search history.

(56) References Cited

U.S. PATENT DOCUMENTS

| 4,964,029 A * | 10/1990 | Severinsky ......... H02M 3/1582 363/80 |
| 5,323,258 A * | 6/1994 | Tsushima ............... H04B 10/61 398/152 |

(Continued)

FOREIGN PATENT DOCUMENTS

JP  2004208185  7/2004

OTHER PUBLICATIONS

Notification of Transmittal of the International Search Report and the Written Opinion dated Oct. 29, 2018 from the International Search Authority—The European Patent Office—for International Application No. PCT/US2018/047178, 19 pages.

(Continued)

*Primary Examiner* — Tuan T Lam
(74) *Attorney, Agent, or Firm* — Jackson Walker LLP (57) ABSTRACT

A high temperature (HT) gate driver for Silicon Carbide metal-oxide-semiconductor field-effect transistor (SiC MOSFET) uses commercial off-the-shelf COTS discrete components, and has an integrated short-circuit or overcurrent protection circuit and under voltage lock out (UVLO) protection circuit.

4 Claims, 5 Drawing Sheets

(51) Int. Cl.
*H03K 17/14* (2006.01)
*H03K 17/687* (2006.01)
*H03K 17/691* (2006.01)

(56) References Cited

U.S. PATENT DOCUMENTS

2007/0171590 A1* 7/2007 Nagata .................. H03K 17/18
361/93.1
2015/0249417 A1* 9/2015 Rancuret .................. H02P 9/10
322/20

OTHER PUBLICATIONS

Feng Qi, et al., "A High Temperature De-Saturation Protection and Under Voltage Lock Out Circuit for SiC MOSFET", 2015 IEEE Energy Conversion Congress and Exposition (ECCE), IEEE, Sep. 20, 2015, pp. 6169-6174.

Feng Qi, et al., "Peripheral Circuits Study for High Temperature Inverters Using SiC MOSFETs", Graduate Program in Electrical and Computer Engineering—The Ohio State University—2016, 150 pages.

Notification of Transmittal of the International Preliminary Report on Patentability containing the Written Opinion from the International Search Authority—The European Patent Office—dated Mar. 12, 2020 from the International Bureau of WIPO for International Application No. PCT/US2018/047178, 13 pages.

* cited by examiner

FIG. 7

HIGH TEMPERATURE GATE DRIVER FOR SILICON CARBIDE METAL-OXIDE-SEMICONDUCTOR FIELD-EFFECT TRANSISTOR This application claims priority to U.S. Provisional Patent Application No. 62/551,982, entitled "High Temperature Gate Driver for Silicon Carbide Metal-Oxide-Semiconductor Field-Effect Transistor," filed Aug. 30, 2017, the entire contents of which are hereby incorporated by reference.

BACKGROUND

This disclosure pertains to high temperature (HT) gate drivers for silicon carbide metal-oxide-semiconductor field-effect transistor (SiC MOSFET) based HT converters.

Major MOSFET gate driver manufacturers produce gate drivers based on Si complementary metal-oxide-semiconductor (CMOS) technology. These gate drivers cannot operate beyond 125° C. due to the thermal limitation of Si material. Therefore, these gate drivers are not suitable for HT converters.

Other manufacturers make HT gate drivers for SiC MOSFET. These gate driver ICs are fabricated using silicon-on-insulator (SOI) technology. The maximum operating temperature of the gate driver ICs are 230° C. and 225° C. in some examples. Although SOI technology could be used to develop gate driver ICs for HT operation, the complex manufacturing process increases the cost. Gate driver ICs developed using the SiC fabrication process and operating as high as 400° C. have been reported. However, SiC IC fabrication technology is not still mature enough for commercialization.

As an alternative to high-cost SOI ICs and SiC fabrication technologies, HT gate drive circuits can also be developed with commercial-off-the-shelf (COTS) discrete transistors and diodes that can operate at higher temperatures (180° C. to 200° C.). HT gate drivers developed with a combination of COTS discrete components and SOI based ICs have been reported. The propagation delay of these gate drivers is relatively large due to a high number of SOI ICs. Moreover, these gate drivers do not have desaturation and under voltage lock out protection features.

HT gate drivers for SiC MOSFET built with discrete components for higher device current rating have also been proposed. The reported gate driver has desaturation and under voltage lock out protection circuit. It has been tested at a DC bus voltage of 400 V and device current of 350 A in a double pulse test setup. The numbers of HT transistors were high in the reported gate driver circuit. As a consequence, propagation delay in the protection circuit is high. The reference voltage for the reported desaturation protection circuit is fixed in this gate driver, which limits the protection for a full range of device currents.

SUMMARY

The present disclosure relates generally to a high temperature (HT) gate driver with an integrated short-circuit or overcurrent protection circuit and under voltage lock out (UVLO) protection circuit for Silicon Carbide metal-oxide-semiconductor field-effect transistor (SiC MOSFET). A SiC MOSFET can operate at a junction temperature of 200° C. to 250° C. due to its improved material properties and thermal stability. However, successful realization of SiC MOSFET based high temperature (HT) converters requires HT gate drivers.

The presented low cost HT gate driver was developed with commercial-off-the shelf (COTS) discrete transistors and signal diodes based on silicon technology that are rated for 180° C. to 200° C. The gate driver has a robust overcurrent or short-circuit protection circuit and under voltage lock out protection circuit. It protects the SiC MOSFET from both fault under load (FUL) and hard switched fault (HSF) condition. The gate driver protects the SiC MOSFET during short-circuit fault and under voltage lock out (UVLO) fault in a high temperature environment (maximum up to 180° C.). It has very low fault propagation delay time. The propagation delay of the protection circuit and gate driving circuit are greatly reduced compared to commercial silicon-on-insulator (SOI) technology based HT gate drivers. Low propagation delay in the protection circuit in HT environment not only reduces the device current level where it has to turn-off but it also minimizes the self-heating of the device. Additionally, overshoot in the device voltage is greatly reduced during turn-off switching transient under hard switched fault condition. These responses enhance the lifetime of the SiC MOSFET in harsh HT environment.

The HT gate driver has several advantages. It can reliably operate up to 180° C. The reference for the short-circuit protection can be varied. This provides flexibility to select desired fault current level. The propagation delay in the sensing and control unit is very small. This increases the reliability of the gate driver. The self-heating of the device can be reduced to a large extent due to fast protection response of the proposed gate driver. The blanking time of the gate driver can be brought down to zero. This zero blanking time provides full protection to the device over a switching cycle. Finally, the cost of the developed HT gate driver prototype is less than $100 compared to about $2000 for a commercial HT gate driver.

DETAILED DESCRIPTION OF PREFERRED EMBODIMENTS

The present disclosure relates to a high temperature (HT) gate driver with integrated short-circuit or overcurrent protection circuit and under voltage lock out (UVLO) protection circuit for SiC MOSFET using commercial off-the-shelf COTS discrete components.

A first feature of the HT gate driver relates to an overcurrent and under voltage lock out detection technique. Overcurrent conditions for bipolar devices like Si insulated gate bipolar transistors (IGBTs) are detected by a desaturation (DESAT) detection technique. The Si IGBT pulls out of saturation once the collector current exceeds the knee point of its output characteristics. The resultant increased collector-emitter voltage activates the DESAT protection circuit of the gate driver. The DESAT protection level for IGBTs is generally fixed around 7 V.

Figure 1:
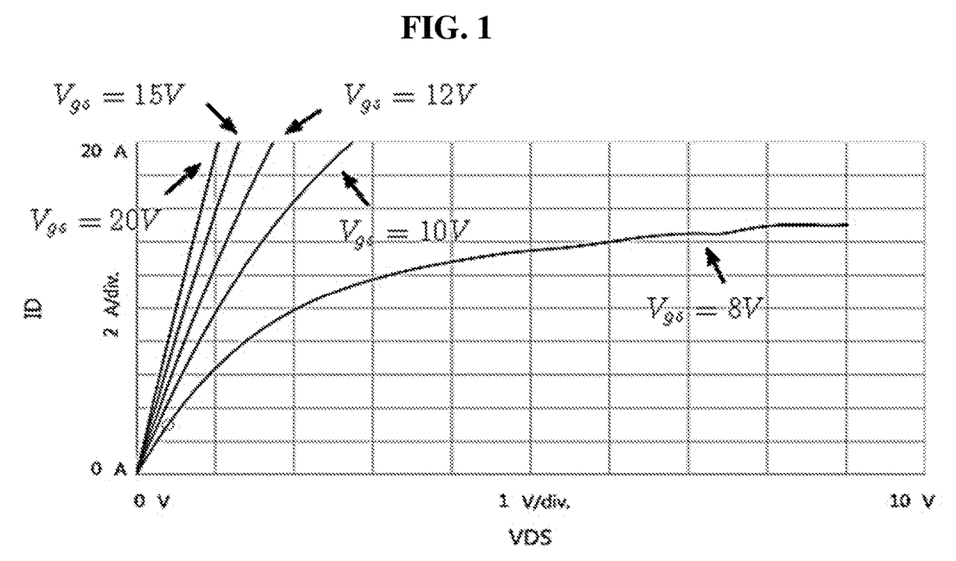
FIG. 1 shows output characteristics of a tested SiC MOSFET at different gate voltages ($V_{gs}$). Scale: $V_{ds}$=1 V/div; $I_d$=2 A/div.

In the case of unipolar devices like SiC MOSFETs, the DESAT protection depends on the ratings of the devices. It can be implemented for high current and high voltage SiC MOSFETs because their output characteristics in the active region are similar to Si IGBTs. However, the transition from ohmic region to active region is not well defined for low current rating SiC MOSFETs. It spreads over a wide range of device current magnitude due to short channel effects. FIG. 1 depicts the output characteristics of a commercially-available 1200 V, 35 A SiC MOSFET (MT5F31003, Fuji Electric) at different gate voltages recorded by the device analyzer. It can be noticed that the drain-source voltage ($V_{ds}$) is only 1 V at a device current ($I_d$) of 20 A for the gate voltage ($V_{gs}$) of 20 V. Therefore, SiC MOSFET requires very high device current for the on-state drain-source voltage to reach the DESAT protection threshold. In this scenario, the device would fail by overcurrent before the DESAT protection circuit is activated.

Figure 2:
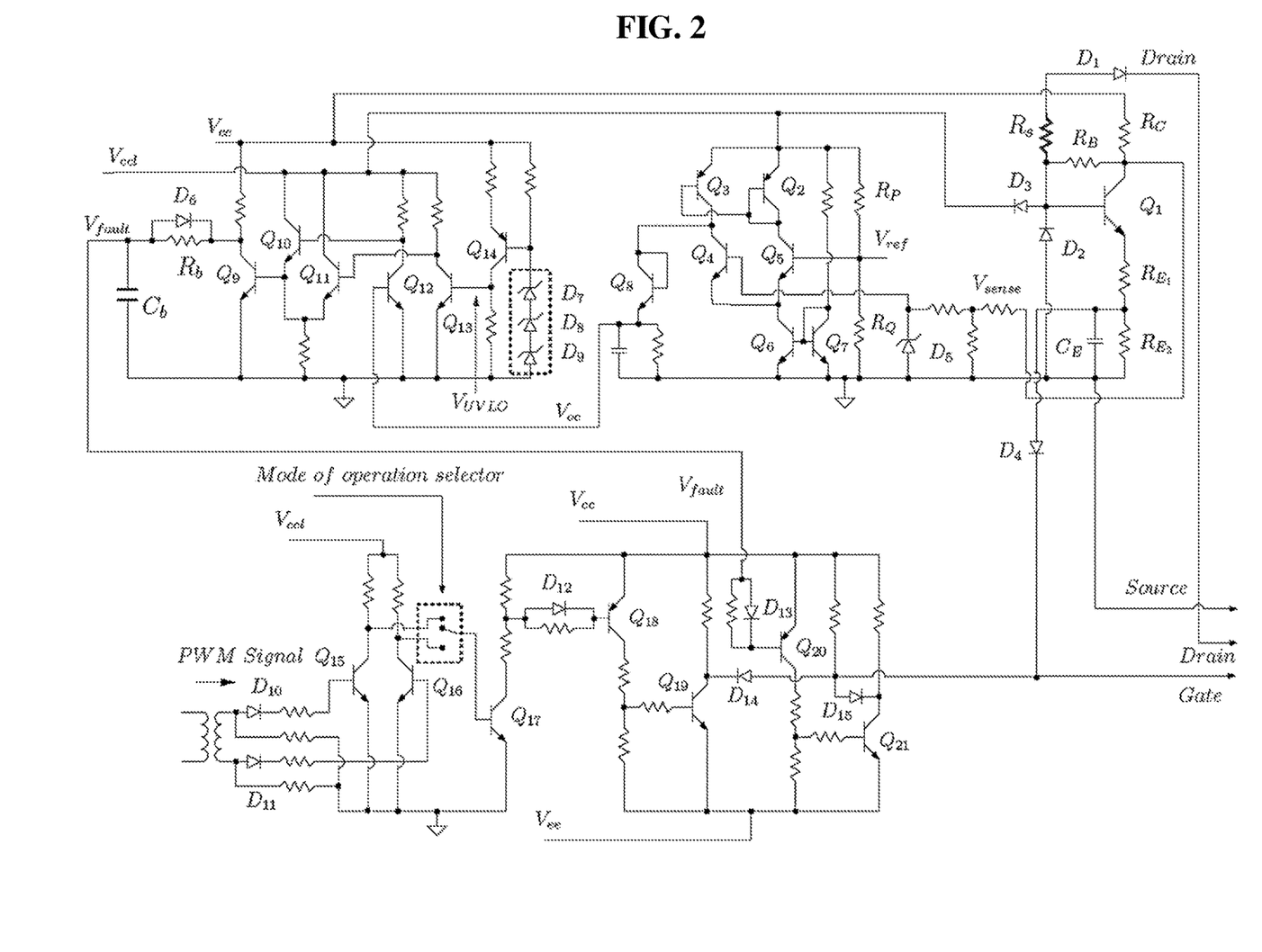
FIG. 2 shows a schematic representation of a preferred embodiment of a high temperature (HT) gate driver circuit.

The present HT gate driver includes a high temperature (HT) overcurrent or short-circuit protection circuit for lower current rating SiC MOSFETs with 8 discrete HT transistors. The on state drain-source voltage is monitored through an amplifier circuit. The conditioned drain-source voltage is compared with the desired reference voltage in a comparator circuit to generate fault signal during overcurrent scenario. The amplification of the on-state drain-source voltage ($V_{dson}$) is required to accurately monitor $V_{dson}$ even during very low device current, as $V_{dson}$ is very low for lower device current. A schematic representation of a preferred design for the overcurrent detection circuit is shown in FIG. 2.

There are two important factors to be taken into consideration for the reliable operation of the overcurrent protection circuit for SiC MOSFET. First, the overcurrent protection circuit should provide required blanking time to let the drain-source voltage of the device to drop to its on-state value during turn on switching transients to avoid false triggering. It is important to mention that the fault current can rise to a very high value for SiC MOSFET during the blanking time because of its larger triode region. Therefore, judicious selection of blanking time is necessary. Second, the protection circuit should be activated only during the on-state duration to avoid any spurious triggering resulted due to the switching of other devices in a converter.

Figure 3:
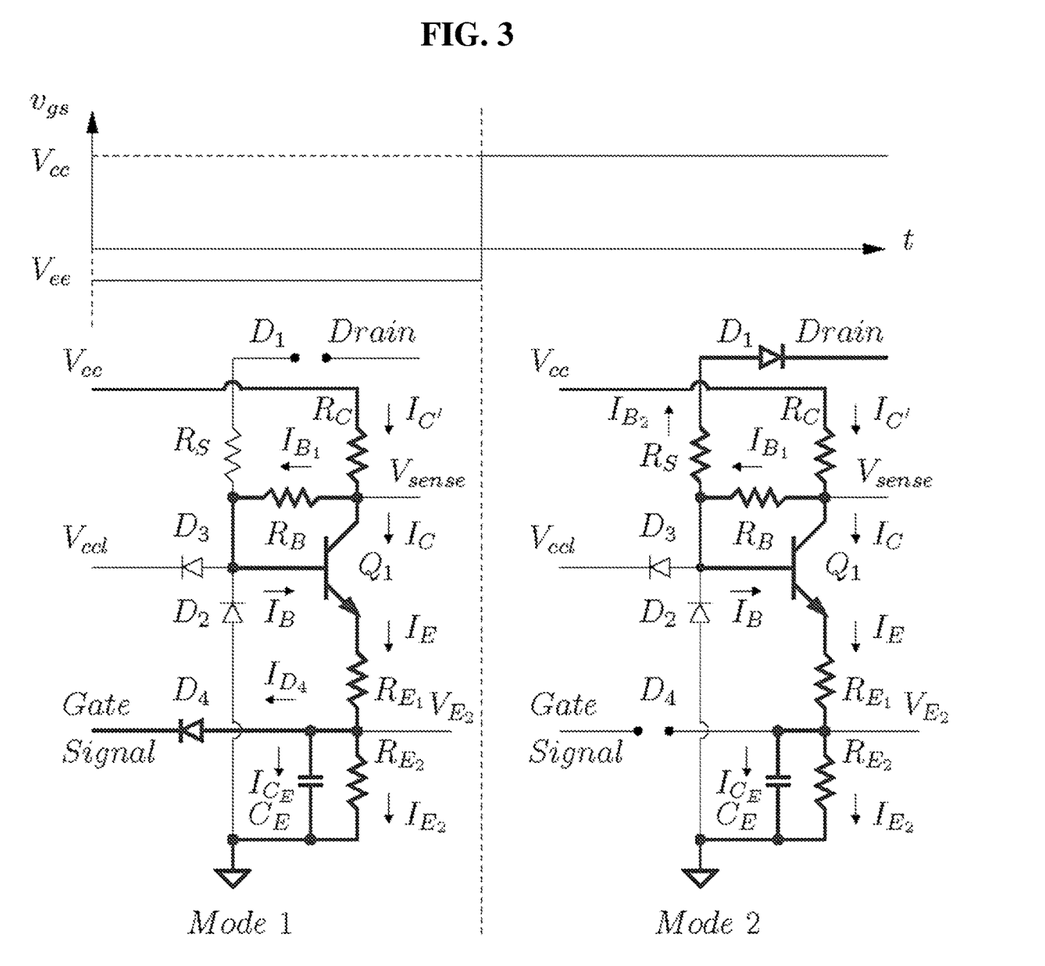
FIG. 3 shows different modes of operation of a preferred embodiment of a device on-state voltage monitoring circuit.

The preferred protection circuit (such as the one shown in FIG. 2) is designed prioritizing these two factors, where it is only activated during the on-state of the SiC MOSFET after the blanking time. As shown in FIG. 2, the on-state voltage is monitored through the high voltage diode D1. This actual on-state voltage is given to the base terminal of transistor Q1. The emitter terminal of Q1 is connected to the gate signal through diode D4 and emitter resistor $R_{E1}$. The amplified on-state voltage information ($V_{sense}$) is taken from the collector terminal of Q1. The operation of this on-state voltage monitoring circuit can be discussed in two modes as shown in FIG. 3.

Mode 1: This mode is defined for the off-state duration (i.e. gate voltage ($V_{gs}$) is negative). As the device under test (DUT) is in off condition, the diode D1 is reverse biased. In this interval, the gate signal is fixed at a negative gate voltage ($V_{gs}=-5$ V) resulting in diode D4 being forward biased (FIG. 3). Due to the conduction of diode D4, the voltage across capacitor $C_E$ ($V_{E2}$) is clamped to −5 V. In this circuit condition, the sensed device voltage ($V_{sense}$) can be represented by equations (1)-(3) shown below.

$$V_{sense} = V_{cc} - I_C \cdot R_C \quad (1)$$

$$= (I_{B1}R_B + V_{BE} + I_E R_{E1}) + V_{E2} \quad (2)$$

$$= (I_{B1}R_B + V_{BE} + I_E R_{E1}) - 5V \quad (3)$$

Figure 4:
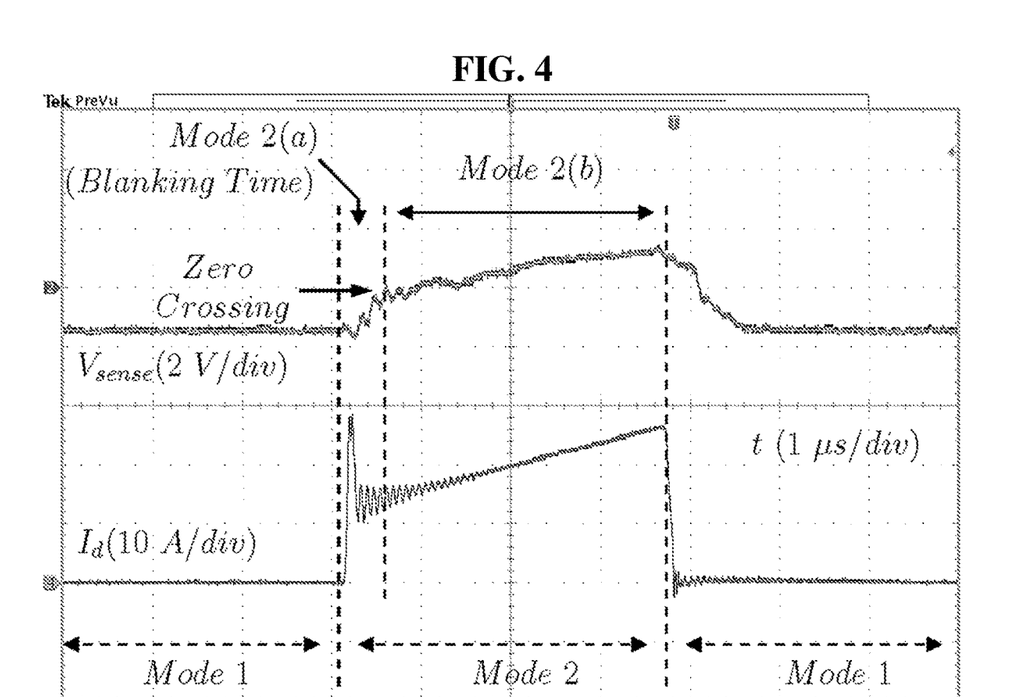
FIG. 4 shows different modes of operation of a preferred embodiment of an overcurrent protection circuit.

In the above equations, the parameters have their usual meaning as given in FIG. 3 and $V_{cc}$ is the positive supply voltage. As per (3), $V_{sense}$ can be brought to a negative value by appropriate biasing resistor selection (i.e. by maintaining $I_{B1}R_B+V_{BE}+I_E R_{E1}$ term less than 5V). This negative $V_{sense}$ will not allow the protection circuit to trigger during off-state duration as it works only for a positive on-state voltage information. FIG. 4 depicts a hardware test result of the on-state voltage detection circuit where the $V_{sense}$ is clamped to a negative voltage during Mode 1.

Mode 2: This mode is defined for the on-state duration (i.e. $V_{gs}$ is positive). Mode 2 can be subdivided into two sub-modes termed as mode 2(a) and mode 2(b). The duration of mode 2(a) includes the turn-on duration of SiC MOSFET and additional blanking time ($t_{blk}$). The rest of the on-state duration is allocated to mode 2(b).

During the turn-on duration of mode 2(a), diode D4 gets reverse biased as the gate signal has moved to the positive gate voltage ($V_{gs}=20$ V). However, the diode D1 remains reverse biased till device voltage falls to the steady on-state voltage. In this transient circuit condition, the capacitor $C_E$ voltage ($V_{E2}=-5$ V) tries to discharge through $R_{E2}$ and moves towards 0 V. In order to limit the rate of discharge of $V_{E2}$ in this duration, a high value of $R_{E2}$ is selected. It can be stated here that $V_{E2}$ almost stays at −5 V and (3) still holds true for $V_{sense}$ maintaining a negative voltage (FIG. 4). As a result, the protection circuit remains disabled for the turn-on duration.

Once the turn-on duration is over, the diode D1 is forward biased as shown in FIG. 3 and it starts monitoring the on-state device voltage ($V_{dson}$) $V_{dson}$ can be represented by equation (4) in the ohmic region.

$$V_{dson} = (I_d + I_{B2}) \times (R_{dson} + \Delta R_{ton}) \quad (4)$$

In equation (4), $I_d$ is the device current, $I_{B2}$ is the current flowing through $R_S$ and D1 from the on-state voltage monitoring circuit, $R_{dson}$ is the on-state drain-source resistance at room temperature and $\Delta R_{ton}$ is the incremental on-state resistance due to change in junction temperature. In this circuit condition, $V_{sense}$ can be calculated as (7) by solving (2), (5) and (6). $V_b$ is the voltage at the base terminal of Q1.

$$V_b = I_{B2}R_s + V_{D1} + (I_d + I_{B2}) \times (R_{dson} + \Delta R_{ton}) \quad (5)$$

$$I_{B2} = \frac{V_{dson}}{R_{dson} + \Delta R_{ton}} - I_d \quad (6)$$

$$V_{sense} = \left(\frac{V_{dson}}{R_{dson} + \Delta R_{ton}} - I_d\right)R_B + I_E\left(\frac{R_B}{\beta+1} + R_{E1}\right) + V_{BE} + V_{E2} \quad (7)$$

It can be noticed from equation (7) that $V_{sense}$ gradually increases with the increase in on-state voltage ($V_{dson}$) across the device. In this circuit condition, the voltage across $C_E$ ($V_{E2}$) also gradually moves towards a positive voltage due to the injected emitter current depending upon the time constant ($\tau$) of the circuit. However, the protection circuit remains disabled till this increasing $V_{sense}$ crosses 0 V. This duration, starting from the turn-on switching transient till the $V_{sense}$ crosses 0 V is termed as blanking time ($t_{blk}$) as shown in FIG. 4. The blanking time is given by equation (8).

$$t_{blk} = \tau \ln \frac{V_{sense}}{V_{ee}}, \tau \approx R_{E1} \times C_E \qquad (8)$$

The time constant ($\tau$) of the circuit is mostly decided by $R_{E1}$ and $C_E$. It can be concluded here that by selecting the appropriate values of $C_E$ and $R_{E1}$ the blanking time ($t_{blk}$) can be selected for the proposed protection circuit. However, it is important to select a minimum blanking time to increase the reliability of the overcurrent protection circuit. FIG. 4 depicts the experimental results for mode 2(a), where $V_{sense}$ exceeds 0 V line after the blanking time.

During mode 2(b), $V_{sense}$ continues to follow $V_{dson}$ by (7) shown in FIG. 4 providing $V_{dson}$ information of the device. In this circuit, diode D2 and D3 are connected to the base of Q1 to protect its base terminal from any spurious overshoot or undershoot during switching transients.

Figure 5:
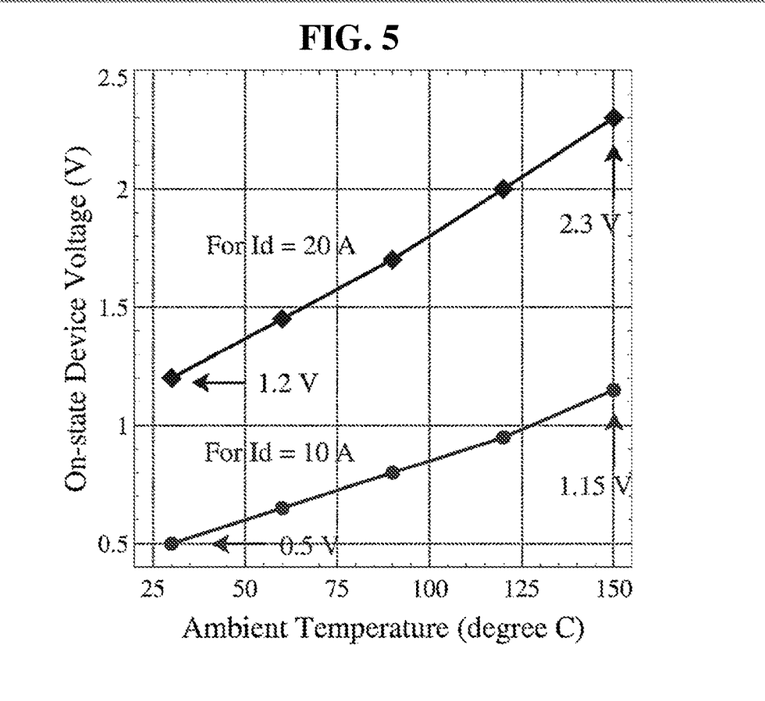
FIG. 5 shows an on-state device voltage profile at different ambient test temperatures.

The on-state device voltage information is compared with the reference signal corresponding to desired fault current level in a comparator circuit shown in FIG. 2. It is stated in equation (4) that $V_{dson}$ is the product of current flowing through the device and the on-state resistance in the ohmic region. However, on-state resistance is a nonlinear function of device current and it increases with increase in test temperature. Therefore, it is important to analyze the variation of on-state resistance with device current at different test temperatures prior to selecting desired reference voltage. For the device under test (DUT) (MT5F31003 from Fuji Electric), $R_{dson}$ is 60 mΩ at an ambient temperature of 30° C. for an $I_d$ of 20 A. It is increased to 115 mΩ ($\Delta R_{ton}$=55 mΩ) at 150° C. This increase in on-state resistance results in higher on-state voltage drop ($V_{dson}$) for a fixed amount of device current with the increase in test temperature. FIG. 5 depicts the on-state device voltage profile of the DUT at different ambient test temperatures ($T_a$) for a device current of 10 A and 20 A. The $V_{dson}$ is found to be 1.2 V at a $T_a$ of 30° C. and 2.3 V at 150° C. for LI of 20 A. In this condition, if the reference voltage is fixed corresponding to any of these extreme points, it will result in an error in operation for a wide range of operating temperatures. However, an optimum result can be achieved if the reference voltage is selected corresponding to a midpoint of these two extreme operating points. Therefore, the reference voltage corresponding to the midpoint of $V_{dson}$ curve shown in FIG. 5 is fixed for the optimum result of the proposed protection overcurrent circuit.

Importantly, this error will widen with the increase in the device current rating. It is observed that for a device current of 20 A, this error causes a deviation of approximately ±6 A in the fault current, which is well within the maximum rated pulsed drain current of the DUT as given in its datasheet. Therefore, the proposed protection technique will provide reliable results till a load current of 20 to 25 A for the applications where the operating ambient temperature varies frequently. However, this technique can be extended for all ranges of device current for the applications where the operational ambient temperature is constant. For example, in the case of HEVs, the temperature under the hood usually stays more than 150° C. In these applications, the reference voltages can be selected corresponding to the extreme points of the $V_{dson}$ curve shown in FIG. 5.

The comparator circuit is preferably designed with 7 HT transistors (Q2 to Q8) as shown in FIG. 2. The reference voltage ($V_{ref}$) is fixed by the voltage divider network with resistors $R_P$ and $R_Q$. The output of the comparator circuit is conditioned by Q8 to generate overcurrent fault status signal ($V_{oc}$) when $V_{sense}$ exceeds $V_{ref}$. The $V_{oc}$ stays at high ($V_{oc}$=$V_{oc1}$=5 V) during normal operation and it is pulled low at the event of overcurrent fault. The comparator circuit only activates after the blanking time when $V_{sense}$ crosses 0 V level and follows $V_{dson}$ as discussed in the above section.

Figure 6:
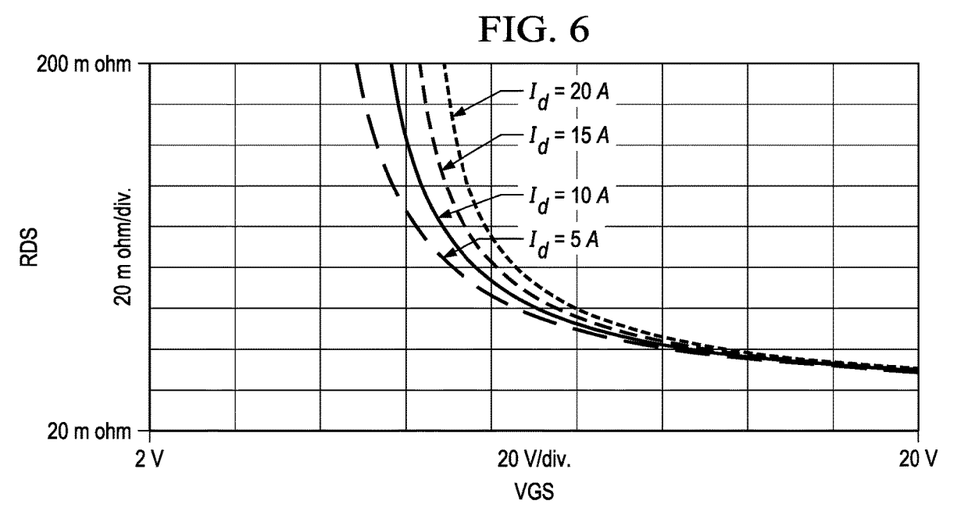
FIG. 6 shows variation of on-state resistance at different gate voltages ($V_{gs}$) for different device current ($I_d$). Scale: $R_{dson}$=20 m/div; $V_{gs}$=2 V/div.

Under voltage lock out (UVLO) protection is another major protection required for SiC MOSFET in high temperature environment. It protects the SiC MOSFET if gate voltage ($V_{gs}$) drops below the minimum required gate voltage given by the manufacturers. Generally, the minimum required gate voltage for SiC MOSFETs is around 18 V. The reduction in gate voltage not only reduces the switching speed, but it also increases the on-state resistance of the device. This increase in on-state resistance increases the conduction loss in the device, which further increases the junction temperature of the SiC MOSFET. The frequent increase in junction temperature can reduce the lifetime of the device in high temperature environment. FIG. 6 depicts the variation of on-state resistance ($R_{dson}$) at different gate voltages ($V_{gs}$) for a range of device currents ($I_d$) obtained from the device analyzer at room temperature. It can be noticed that the on-state resistance increases with reduction in gate voltages.

A preferred design for the VLO protection circuit is depicted in FIG. 2. The transistor Q14 detects the UVLO condition by comparing the supplied positive gate voltage ($V_{gs}$=$V_{cc}$=20 V) with the fixed UVLO reference voltage. The reference voltage for the UVLO condition is fixed at 18 V by three series connected HT Zener diodes (D7 to D9) each rated at 6 V. The transistor Q14 loses base current when gate voltage supply ($V_{gs}$=$V_{cc}$) falls below the reference voltage (18 V). Consequently, the UVLO fault signal ($V_{UVLO}$) goes low indicating a UVLO condition. The final fault detection circuit is designed with transistor Q9-Q13 to generate a single fault signal ($V_{fault}$) for the HT gate driver by combining overcurrent fault ($V_{oc}$) and UVLO fault ($V_{UVLO}$) signals.

The present HT gate driver preferably receives PWM signals through a pulse transformer as shown in FIG. 2. Q15 and Q16 condition the received PWM signals. The collector terminals of these transistors provide non-inverted and inverted PWM signals. Either of these PWM signals can be selected as per the desired mode of operation. The PWM signals are at $V_{cc1}$ (5 V) voltage level. It is necessary to shift the magnitude of PWM signals to the $V_{cc}$ and $V_{ee}$ levels before giving to the SiC MOSFET. $V_{cc}$ (20 V) and $V_{ee}$ (−5 V) are the maximum positive and negative gate voltages required for the SiC MOSFET. It is achieved by the combination of Q17 to Q19. Similarly, the voltage level of the fault signal ($V_{fault}$) is conditioned by Q20 and Q21. The level shifted PWM signal and fault signal are coupled through D14 and D15 to produce final gate signal for the device. These gate signals drive SiC MOSFET through a conventional push-pull buffer circuit. In the event of any fault, $V_{fault}$ goes low and it pulls the gate signal to a low ($V_{ee}$) turning off the device. This fault signal can also be used to stop sending PWM pulses to the gate driver from the DSP or FPGA unit.

Figure 7:
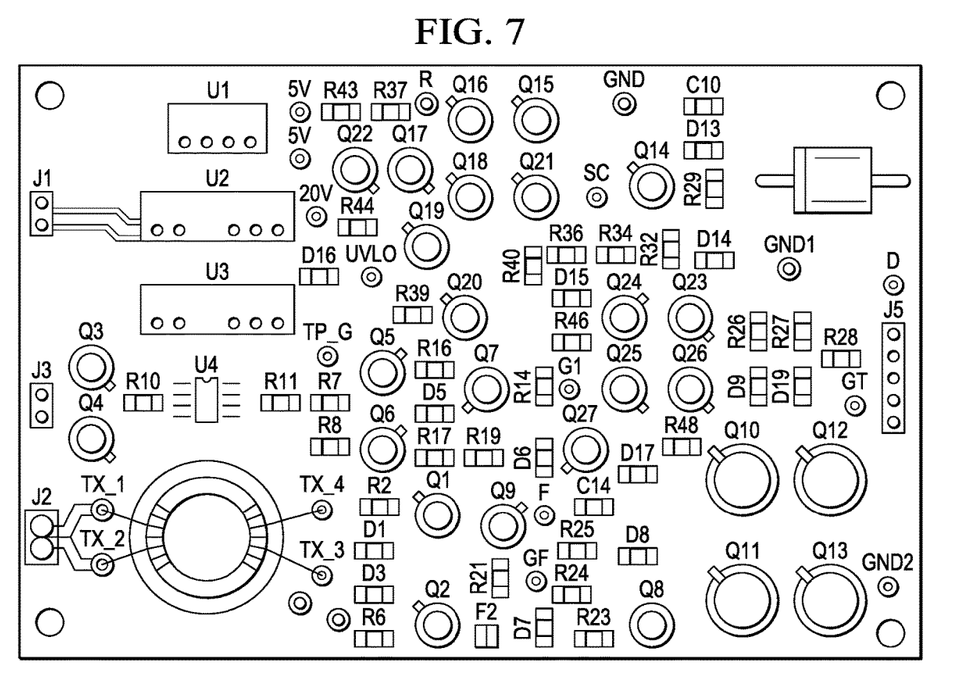
FIG. 7 shows a prototype of a preferred embodiment of a HT gate driver.

A prototype of the HT gate driver has been prepared. The prototype is shown in FIG. 7. Components include NPN transistor, PNP transistor, Zener diode, high voltage diode, signal diode, and pulse transformer. The printed circuit board is made up of FR4 material and it is qualified for the operational temperature of 180° C. The power supply to the gate driver is given from an external source. However, a bank of high temperature capacitors is placed in the gate driver to regulate the supply voltage.

REFERENCES

The following documents and publications are hereby incorporated by reference.

R. Sharp, "The Current Status of High Temperature Electronics for Automotive Use," in Proc. IEE Seminar on Automotive Electronic Standards; Are They? (Ref. No. 1999/206), Nov. 30, 1999, pp. 6/1-6/5.

Z. Wang, X. Shi, L. M. Tolbert, F. Wang, Z. Liang, D. Costinett and B. J. Blalock, "A High Temperature Silicon Carbide MOSFET Power Module With Integrated Silicon-On-Insulator-Based Gate Drive," IEEE Trans. Power Electron., vol. 30, no. 3, pp. 1432-1445, March 2015.

R. L. Greenwell, B. M. McCue, L. Zuo, M. A. Huque, L. M. Tolbert, B. J. Blalock, and S. K. Islam, "SOI-Based Integrated Circuits for High temperature Power Electronics Applications," in Proc. Applied Power Electronics Conference and Exposition (APEC), pp. 836-843, March 2011.

M. A. Huque, S. K. Islam, L. M. Tolbert, and B. J. Blalock, "A 200° C. Universal Gate Driver Integrated Circuit for Extreme Environment Applications," IEEE Trans. Power Electron., vol. 27, no. 9, pp. 4153-4162, September 2012.

Sc Sc Lp and Lic, "High Temperature gate drivers for wide bandgap semiconductor power JFETs and integrated circuits including the same," US Patent, Publication number US7969226 B2, Jun. 28, 2011.

B. A. Reese, J. A. V. Mayorga, I. Escorcia, K. M. Phan, C. P. Gutshall and R. M. Schupbach, "High Temperature Half Bridge Gate Driver," US Patent, Publication number US8643407 B2, Feb. 4, 2014.

N. Ericson, S. Frank, C. Britton, L. Marlino, S. H. Ryu, D. Grider, A. Mantooth, M. Francis, R. Lamichhane, M. Mudholkar, P. Shepherd, M. Glover, J. Valle-Mayorga, T. McNutt, A. Barkley, B. Whitaker, Z. Cole, B. Passmore, and A. Lostetter, "A 4H Silicon Carbide Gate Buffer for Integrated Power Systems," IEEE Trans. Power Electron., vol. 29, no. 2, pp. 539-542, February 2014.

M. Alexandru, V. Banu, X. Jorda, J. Montserrat, M. Vellvehi, D. Tournier, J. Millan, and P. Godignon, "SiC Integrated Circuit Control Electronics for High-Temperature Operation," IEEE Trans. Industrial Electron., vol. 62, no. 5, pp. 3182-3191, May 2015.

R. Ghandi, C. Chen, L. Yin, X. Zhu, L. Yu, S. Arthur, F. Ahmad and P. Sandvik, "Silicon Carbide Integrated Circuits With Stable Operation Over a Wide Temperature Range," IEEE Electron Device Letters, vol. 35, no. 12, pp. 1206-1208, December 2014.

Y. Wang and S. Krishnamurthy, "High Temperature Gate Drive Circuits for Silicon Carbide Switching Devices," in Proc. IEEE Energy Conversion Congress and Exposition (ECCE), 2013, pp. 4258-4262.

S. Waffler, S. D. Round and J. W. Kolar, "High temperature (>>200° C.) isolated gate drive topologies for Silicon Carbide (SiC) JFET," in Proc. IEEE Annual Conference of Industrial Electronics, 2008, pp. 2867-2872.

D. M. Springmann, T. M. Jahns and R. D. Lorenz, "Inverter gate drive and phase leg development for 175° C. operation," in Proc. IEEE Power Electronics Specialists Conference, 2008, pp. 2152-2158.

D. Peftitsis and J. Rabkowski, "Gate and Base Drivers for Silicon Carbide Power Transistors: An Overview," IEEE Trans. Power Electron., vol. 31, no. 10, pp. 7194-7213, October 2016.

R. Wang, D. Boroyevich, P. Ning, Z. Wang, F. Wang, P. Mattavelli, K. D. T. Ngo, and K. Rajashekara, "A High-Temperature SiC Three-Phase AC-DC Converter Design for >100° C. Ambient Temperature," IEEE Trans. Power Electron., vol. 28, no. 1, pp. 555-572, January 2013.

X. Liang, C. Tan and Z. Lin, "High Temperature operation Silicon Carbide Gate Driver," US Patent, Publication number US20130063184 A1, Mar. 14, 2013.

F. Qi and L. Xu, "Development of a High Temperature Gate Drive and Protection Circuit Using Discrete Components," IEEE Trans. Power Electron., vol. 32, no. 4, pp. 2957-2963, April 2017.

F. Qi, L. Xu, B. Zhao and Z. Zhou, "A High Temperature De-Saturation Protection and Under Voltage Lock Out Circuit for SiC MOSFET," in Proc. IEEE Energy Conversion Congress and Exposition, 2015, pp. 6169-6174.

B. Callanan, "Application Considerations for SiC MOSFETs," Cree Inc., Durham, N.C., USA, January 2011, Cree Application Note.

Z. Wang, X. Shi, Y. Xue, L. M. Tolbert, F. Wang and B. J. Blalock, "Design and Performance Evaluation of Overcurrent Protection Schemes for Silicon Carbide (SiC) Power MOSFETs," IEEE Trans. Ind. Electron., vol. 61, no. 10, pp. 5570-5581, October 2014.

What is claimed is:

1. A high temperature (HT) gate driver for silicon carbide metal-oxide-semiconductor field-effect transistor (SiC MOSFET), comprising:

an overcurrent protection circuit, wherein the overcurrent protection circuit comprises
an amplifier circuit, wherein the amplifier circuit produces amplified on-state drain-source voltage for monitoring,
a first diode, wherein the first diode is of high voltage, and wherein the amplified on-state drain-source voltage is monitored through the first diode,
a second diode,
an emitter resistor,
a first high temperature (HT) transistor, wherein a base terminal of the first high temperature (HT) transistor receives actual on-state voltage, wherein an emitter terminal of the first high temperature (HT) transistor connects to a gate signal though the second diode and the emitter resistor, and wherein amplified on-state voltage information is taken from a collector terminal of the first high temperature (HT) transistor, and
a comparator circuit, wherein the comparator circuit comprises a plurality of high temperature (HT) transistors and a voltage divider network, wherein the voltage divider network comprises a first and a second resistor for fixing a reference voltage, and wherein a second high temperature (HT) transistor conditions output of the comparator circuit to generate an overcurrent fault status signal when the amplified on-state voltage exceeds the reference voltage;

a voltage lock out protection circuit, wherein the voltage lock out protection circuit comprises a third high temperature (HT) transistor, wherein the third high temperature (HT) transistor compares a supplied positive gate voltage to a selected under voltage lock out reference voltage and loses base current when the supplied positive gate voltage falls under the under voltage lock out reference voltage, whereby an under voltage lock out fault signal is generated;

a final fault detection circuit comprising a plurality of transistors, wherein the final fault detection circuit generates a single fault signal for the high temperature (HT) gate driver by combining the overcurrent fault status signal with the under voltage lock out fault signal;

a pulse transformer, wherein the pulse transformer comprises a first PWM transistor and a second PWM transistor for receiving and conditioning pulse width modulator (PWM) signals, wherein a PWM signal can be selected for a desired mode of operation;

further high temperature (HT) transistors for shifting magnitude of the PWM signal to produce a level shifted PWM signal and for conditioning voltage level of the single fault signal;

further diodes through which the level shifted PWM signal and single fault signal are coupled to produce a final gate signal; and a push-pull buffer circuit that drives the SiC MOSFET using the final gate signal.

2. The high temperature (HT) gate driver of claim 1, wherein the overcurrent protection circuit operates in an off-state mode in which gate voltage is negative for a selected period of blanking time, wherein the first diode is reverse biased and the second diode is forward biased, wherein the amplified on-state voltage is brought to a negative value by biasing resistor selection, and whereby the overcurrent protection circuit will not trigger.

3. The high temperature (HT) gate driver of claim 2, wherein the overcurrent protection circuit operates in an on-state mode including turn-on duration and additional blanking time, wherein the second diode is reverse biased as gate voltage is positive, wherein the first diode is reverse biased until device voltage falls to steady on-state voltage, and wherein the amplified on-state voltage is maintained at a negative value, and whereby the overcurrent protection circuit will not trigger during a turn-on duration.

4. The high temperature (HT) gate driver of claim 3, wherein the turn-on duration is over, wherein the first diode is forward biased and monitors increasing on-state device voltage, wherein amplified on-state voltage gradually increases, and wherein the overcurrent protection circuit is enabled after the amplified on-state voltage is greater than 0 V.

* * * * *

UNITED STATES PATENT AND TRADEMARK OFFICE
CERTIFICATE OF CORRECTION

PATENT NO. : 11,218,145 B2
APPLICATION NO. : 16/642089
DATED : January 4, 2022
INVENTOR(S) : Kaushik Rajashekara et al.

It is certified that error appears in the above-identified patent and that said Letters Patent is hereby corrected as shown below:

In the Specification

1. In Column 3, Line 18, delete "($Y_{ds}$)" and insert -- ($V_{ds}$) --, therefor.

2. In Column 4, Line 41, delete "($V_{dson}$) $V_{dson}$" and insert -- ($V_{dson}$). $V_{dson}$ --, therefor.

3. In Column 5, Line 13, delete "$R_{E1}$ the" and insert -- $R_{E1}$, the --, therefor.

4. In Column 5, Line 43, delete "LI" and insert -- $I_d$ --, therefor.

5. In Column 6, Line 7, delete "($V_{oc}=V_{oc1}=5V$)" and insert -- ($V_{oc}=V_{cc1}=5V$) --, therefor.

Signed and Sealed this
Twenty-second Day of November, 2022

Katherine Kelly Vidal
*Director of the United States Patent and Trademark Office*